PHOTORESIST MATERIAL AND METHOD OF FORMING PRINTING PLATES AND RESULTING PRODUCT

Filed Feb. 2, 1970

INVENTOR.
Jack Milgrom

BY Bernie A. Lepper

Attorney

United States Patent Office 3,674,486
Patented July 4, 1972

3,674,486
PHOTORESIST MATERIAL AND METHOD OF FORMING PRINTING PLATES AND RESULTING PRODUCT

Jack Milgrom, Concord, Mass., assignor to Arthur D. Little, Inc., Cambridge, Mass.

Filed Feb. 2, 1970, Ser. No. 7,603
Int. Cl. G03c 1/68
U.S. Cl. 96—35.1 15 Claims

ABSTRACT OF THE DISCLOSURE

A photoresist material suitable for exposure through a process transparency to actinic light to produce a letterpress printing plate and a method of producing such a printing plate. Exposure may be accomplished while the plate is mounted on a cylinder to eliminate the need for possible distortion compensation.

The invention relates to printing plates and more particularly to printing plates for letterpress printing which may be made without any need for forming a mold.

Letterpress printing is used in the printing of books, advertising material and the like. It is a process which uses a printing image carrier comprising raised printing indicia on a substrate. Letterpress printing plates are normally formed of metals which must be cast into molds or of plastics which must be molded. More recently photoengraving techniques have been employed. Closely related to letterpress printing is newspaper relief which requires the casting of metal to form the stereotype plates that print the newspaper.

The necessity to form a mold, whether it is used to shape metal or plastic printing plates, is time-consuming and relatively expensive. Thus, the possibility of forming a printing plate directly through some photographic process is very attractive, provided it can be used to form letterpress printing plates which will be economical in cost and capable of producing good copy for a large number of impressions. It has now been found in accordance with this invention that certain elastomeric resin materials can be used to achieve these diserata.

It is therefore a primary object of this invention to provide a novel article of manufacture which may be used to form letterpress plates which do not require any molding operation and which may be formed directly by photographic techniques. It is another object of this invention to provide such an article which possesses a wide degree of flexibility in use and form, including the ability to be made into cylindrical press forms which eliminates any compensation for possible distortion. It is another principal object of this invention to provide a method of forming an improved letterpress printing plate in any desired configuration. It is another object of this invention to provide such a method which does not require any molding step. It is yet another primary object of this invention to provide an improved method of letterpress printing. Other objects of the invention will be part be obvious and will in part be apparent hereinafter.

The invention accordingly comprises several steps and the relation of one or more of such steps with respect to each of the others, and the article possessing the features, properties, and the relation of elements, which are exemplified in the followed detail disclosure, and the scope of the invention will be indicated in the claims.

For a fuller understanding of the nature and objects of the invention, reference should be had to the following detailed description taken in connection with the accompany drawings in which FIGS. 1–4 illustrate the steps in one processing embodiment of this invention using the printing plate of this invention, these steps including exposing, formation of a latent image, attaching to a substrate, and development of the latent image.

Figure 1:
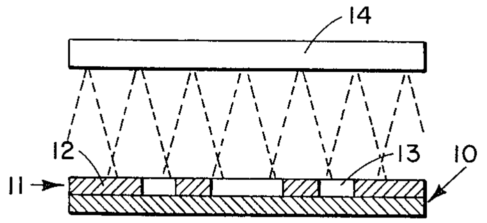

In accordance with this invention a printing plate is formed by compounding an elastomeric resin with a photosensitizing agent and a crosslinking agent for one of the components of the resin and forming it into a plate which is essentially colorless, i.e., essentially transparent. In the method of this invention the plate thus formulated is exposed to actinic light, e.g., to ultraviolet radiation, through a process transparency. The radiation which is transmitted through the indicia areas of the transparency strikes the plate to crosslink the elastomer in and under these indicia areas. The plate is then treated with a solvent for the noncrosslinked areas to remove the material around the indicia and form a printing plate surface in the form of raised printed areas. The plate may be attached to a substrate backing prior to the removal of the noncrosslinked, nonprinting background areas or it may be constructed in a manner so that it provides its own substrate backing. If a cylindrically formed printing plate is to be made, the exposure may be carried out with the elastomeric printing plate blank and the process transparency mounted on a cylinder of the same diameter as the press on which the plate is eventually to be mounted. In this manner the plate may be constructed without the need for compensating for any possible distortions.

The plate blank to be used for exposure to the negative must be formed of an essentially colorless, water-clear elastomeric material which is, in its noncrosslinked state readily soluble in organic solvents. It must possess, in this sheet form, high strength, some resiliency and a degree of elongation. It should also be a thermoplastic material which can be readily formed into films or sheets by being cast from a solution or pressure fused. Contained in the elastomeric sheet are a photosensitizer which is capable of developing free radicals when exposed to the desired actinic light and a crosslinking agent for at least one component of the elastomeric material. The crosslinked material formed upon exposure to actinic light must be insoluble in at least some of the solvents in which the noncrosslinked material is soluble.

An elastomeric resin material which meets these requirements and which is particularly suited for the practice of this invention is described in U.S. Pat. 3,265,765. It is an unvulcanized elastomeric block copolymer comprising multiple blocks of two different polymer segments. The first of these segments (e.g., styrene) is a nonelastic thermoplastic constituent which is an amorphous polymer having a glass transition temperature above about 25° C. The second segment is a rubber-like constituent (a conjugated diene such as polybutadiene or polyisoprene) which is an amorphous polymer having a glass transition temperature below about 10° C. This elastomeric block copolymer material is clear in thin sheet form and transmits ultraviolet radiation. The segments have relatively low molecular weights, that for the nonelastomeric block ranging between 2,000 and 100,000 and that for the elastomeric block ranging between 25,000 and 1,000,000. The copolymer is readily soluble in organic solvents such as benzene, toluene, xylene, diethyl ether, cyclohexane, carbon tetrachloride, carbon disulfide, etc., and insoluble in n-pentane, diisopropyl ether, acetone, acrylonitrile, isopropyl alcohol, and the like.

At room temperatures this copolymeric material has rubber-like properties including good strength, resiliency and elongation. However, it is thermoplastic, being moldable under heat and pressure. When exposed to ultraviolet radiation in the presence of a photosensitizer and crosslinking agent for the rubber-like constituent, it is crosslinked into a material which is not soluble in at least some of the solvents in which the noncrosslinked material is soluble.

The photosensitizers suitable for incorporating into the resin material may be defined as those which are capable through one of several mechanisms of producing free radicals when activated by the actinic light being employed, the free radicals in turn being capable of initiating and promoting the crosslinking of the rubber-like polymer constituent of the resin.

Free radical formation by these activators may be by one of several well-known mechanisms which may be summarized as follows. The initiator I absorbs light to form an excited species, I*

$$I + h\nu \rightarrow I^*$$

diradical formation $$I^* \rightarrow \cdot I \cdot \text{ or } I^* + M \rightarrow \cdot IM \cdot$$

homolytic cleavage $$I^* \rightarrow C\cdot + D\cdot$$

electron transfer $$I^* + F \rightarrow I\cdot + F\cdot$$

hydrogen transfer $$I^* + RH \rightarrow HI\cdot + R\cdot$$

(See for example Photographic Science and Engineering 7:162 (1963), "Image-Forming Systems Based on Photopolymerization.")

A number of diverse compounds are known in the art which meet the requirements for the activators of this invention and the following list is given as illustrative of a number of different classes; and it is not meant to be limiting:

(1) carbonyl compounds
  polynuclear quinones
  α-diketones (benzil)
  α-hydroxyketones (benzoin)
  acyloin ethers (benzoin methyl ether)
  α-alkyl substituted aromatic acyloins (α-methyl benzoin);
(2) azo and diazo compounds
  diazonium chloride of p-aminodiphenylamine
  α-azobis (1-cyclohexane carbonitrile);
(3) organic sulfur compounds
  disulfides (dibenzyl disulfide)
  mercaptans (2-mercaptobenzothiazole)
  metal mercaptides (mercuric phenylmercaptide)
  o-alkyl xanthene esters (carbalkoxymethylene bis-(n-propyl xanthene))
  thiuram derivatives (tetramethylthiuram disulfide)
  sulfenates (ethyl-2-benzothiazylsulfenate);
(4) peroxides
  di-tertiarybutyl peroxide
  hydrogen peroxide;
(5) miscellaneous redox systems
  salts of iron, cobalt and nickel
  β-naphthol
  persulfates
  alkali metal salts of anthraquinone sulfonic acid
  salts of heavy metals including zinc and silver
  divalent tin salts (stannous chloride)
  metal alkyls (tetraethyl lead)
  inorganic sulfides, selenides and tellurides
  uranyl salts of mono- and dicarboxylic acids.

(See for example Jaromir Kosar "Light-Sensitive Systems," John Wiley and Sons, Inc., New York, 1965, Chapter 5, and U.S. Pats. 2,880,152, 3,065,160 and 3,099,558 for further descriptions of one or more classes of these photosensitizers.)

In compounding the photoresist sheet to be used in forming the plates it is preferable to use the minimum amount of photosensitizer compatible with exposure intensity and time used. It appears that at least some of the photosensitizers act as light screens, thus materially reducing the rate at which the actinic radiation penetrates into the resin sheet. Photosensitizers in amounts ranging from about 0.01 to 1.0% by weight of the resin may be added. Preferably this amount will range between about 0.01 and 0.05% by weight. As described in conjunction with FIG. 8, this screening effect may be minimized by making the resin sheet to have a photosensitizer concentration gradient across its thickness.

The crosslinking agent added to the elastomeric resin is a multi-functional olefin. Such crosslinking agents include, but are not limited to, triallyl cyanurate, pentaerythritol triacrylate and polyvinyl cinnamate. In most instances these crosslinking agents should not absorb any appreciable amount of radiation in the same wavelength range as the photosensitizers. An exception to this is the case where a single compound serves as both the crosslinking agent and the photosensitizer. Unlike the photosensitizer, the amount of crosslinking agent may vary over a wide range, e.g., from about 0.1 to 10% by weight of the resin. Its composition and amount will be determined by the composition and amount of the rubber-like polymer constituent in the resin and by the characteristics desired in the raised printing surfaces.

In compounding the clear sheets to be processed into letterpress printing plates the elastomeric resin is thoroughly mixed with the photosensitizer and the crosslinking agent. The mixture may be dissolved in a suitable solvent to complete mixing. After removal of any solvent the resinous mixture is comminuted and hot pressed or extrusion molded into sheets of the desired thickness. This produces an essentially clear sheet which is ready for processing to form a printing plate.

Figure 2:
Figure 3:
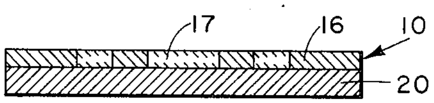
Figure 4:
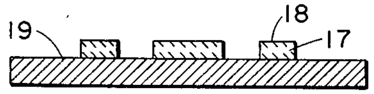

The formation of a letterpress printing plate is illustrated in diagrammatic cross section in FIGS. 1–4 where no attempt is made to show any of the elements to scale. As seen in FIG. 1, the elastomeric resin clear sheet 10 is contacted with a transparency 11 which has dark or nontransparent areas 12 and transparent areas 13, the former corresponding to the background nonprinting areas of the final printing plate and the latter corresponding to a reverse-reading copy of the indicia to be printed in the case of a negative. The assembly of sheet 10 and negative 11 is exposed to a source of ultraviolet light 14 to form a sheet **10*a* which has soluble areas 16, corresponding to the background nonprinting areas, and crosslinked, insoluble areas 17 corresponding to the desired raised indicia areas (FIG. 2). The exposed sheet may then be adhered to a substrate 20 (FIG. 3) such as a sheet of cured natural rubber. The final step then comprises the dissolving of the soluble areas 16 to leave recessed nonprinting areas 19 and the raised printing indicia 17 with printing surfaces 18** (FIG. 4).

Figure 5:
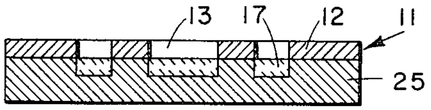
FIGS. 5–7 illustrate the steps in another process embodiment wherein the printing plate serves as the substrate.
Figure 6:
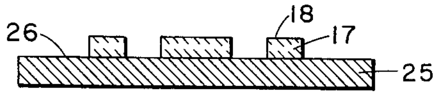
Figure 7:
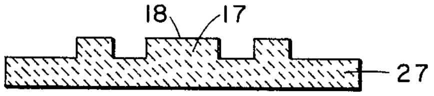

As an alternative to providing a separate substrate, the sheet blank of this invention may be made of sufficient thickness to provide an integrated substrate backing. Upon exposure (FIG. 5) to a negative 11 such a thick sheet 25 develops crosslinked areas 17 only through a part of its thickness. The dissolving step is then carried out for a sufficient time and under proper conditions to remove that part of the background noncrosslinked areas 26 equivalent in depth to the depth of the crosslinking areas 17 or slightly less than the crosslinked depth. Then the plate of FIG. 6 is exposed to actinic light to crosslink the background nonprinting portion to form a self-substrate 27.

Figure 8:
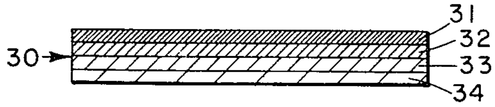
FIG. 8 is a modification of a printing plate formed in layers in accordance with this invention.
Figure 9:
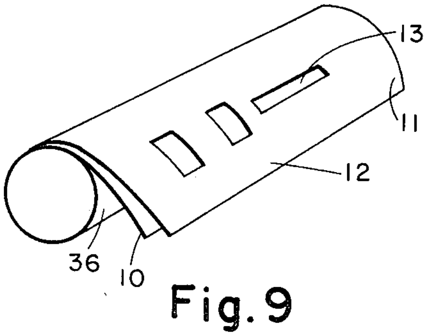
FIG. 9 shows a formation of a printing plate on a cylinder to prevent distortion.

Because the photosensitizers sometimes behave as a light screen, it may be preferable for some uses to form the sheet blank in layers as is shown in FIG. 8. The sheet blank 30 is there illustrated to be formed of four layers 31–34, layer 31 providing the surface for contact with the process transparency during exposure. The amount of photosensitizers in these layers is increased from layer 31 to layer 34.

The exposure to ultraviolet light through a negative 11 may be carried out with the sheet blank 10 mounted on a cylindrical drum 36. The drum is preferably the same diameter as the press roll to be used, and in fact may be the press roll provided proper conditions are provided for dissolving out the noncrosslinked areas and also provided that a separate substrate backing does not have to be affixed.

The invention may be further described with reference to the following examples which are meant to be illustrative and not limiting.

The resin used in the following examples was a thermoplastic rubber-like polymer described in U.S. Pat. 3,265,765. The material is a block copolymer of polystyrene and polybutadiene. In each formulation 10 grams of the resin material in the form of dry pellets was employed. The following photosensitizers and crosslinking agents were added in these formulations, each being given an example number.

| | Example Number | | | | | | | | |
|---|---|---|---|---|---|---|---|---|---|
| Additive [1] | 1 | | 3 | 4 | 5 | 6 | 7 | 8 | 9 |
| Photosensitizer: | | | | | | | | | |
| Benzoin | | 0.02 | 0.02 [1] | | 0.10 | | | | |
| Phenanthrenequinone | | | | 0.2 | | | | | |
| Michler's ketone | | | | | | 0.0007 | 0.007 | 0.014 | 0.14 |
| Crosslinking agent: | | | | | | | | | |
| Triallyl cyannurate | 0.60 | 0.60 | | 0.60 | 0.60 | | | 0.60 | 0.60 |
| Pentaerythritol triacrylate | | | 0.60 | | | | | | |
| Polyvinyl cinnamate [2] | | | | | | 0.013 | 0.133 | | |

[1] Numbers are in grams/10 grams of resin.
[2] Serves as photosensitizer as well as crosslinking agent.

In making these formulations into photoresist sheets, the pellet material was thoroughly dry mixed with the additives and then the mixture was dissolved in about 50 cc. of methylene chloride. Sufficient solvent should be used to completely dissolve the resin. The amount of solvent above this indicated minimum is not critical; however, it is preferred to use an amount approaching the minimum to reduce the quantity of solvent which must be subsequently removed and recovered. After the methylene chloride was removed by evaporation, the resulting composite material was comminuted into small pieces which were molded into sheets using a pressure of 25,000 p.s.i. and 225° F. For these examples, the sheet ranged in thickness between 39 and 46 mils.

Sheets of each of the nine formulations were contacted with a photographic negative serving as the process transparency (as in FIG. 1) and exposed to ultraviolet radiation from a 435-watt ultraviolet lamp (Hanovia Lamp Division, Engelhard Hanovia, Inc.) for from about 4 to 128 minutes. Subsequent to this exposure the sheets were adhered to a glass surface with cement and then the unexposed nonprinting background areas were washed out with xylene.

Of Examples 1–5, Example 1 containing no photosensitizer, did not develop any perceptible printing surface; while Examples 2 and 3, with the smaller amounts of benzoin as photosensitizer were observed to have raised printing surfaces of the order of 5 to 10 mils. Example 5 had a perceptible printing surface but Example 4, which contained 2% by weight of the photosensitizer, was not satisfactory, due apparently to excessive light screening by the high content of the photosensitizer.

Of Examples 6–9, Examples 6 and 7 gave the best printing surfaces with raised indicia ranging between 10–13 mils high in Example 6, and between 16–25 mils in Example 7. Example 8 had raised indicia of about 6 mils while Example 9, with a 10-fold increase in photosensitizer over Example 8, had no perceptible indicia on the surface.

Generally, indicia heights between 15 and 40 mils are desirable for good letterpress printing. However, the conditions of printing and the number of impressions desired may determine this parameter.

It will thus be seen that the objects set forth above, among those made apparent from the preceding description, are efficiently attained and, since certain changes may be made in carrying out the above method and in the article set forth without departing from the scope of the invention, it is intended that all matter contained in the above description or shown in the accompanying drawing shall be interpreted as illustrative and not in a limiting sense.

I claim:

1. As a new article of manufacture a photoresist sheet material suitable for exposure to actinic radiation through a process transparency to form a printing plate with raised indicia surfaces, comprising an essentially colorless elastomeric resin characterized as being a block copolymer formed of a nonelastic thermoplastic styrene polymer constituent which is an amorphous polymer having a glass transition temperature above about 25° C. and a molecular weight between about 2000 and 100,000 and a rubber-like conjugated diene polymer constituent capable of being crosslinked which is an amorphous polymer having a glass transition temperature below about 10° C. and a molecular weight between about 25,000 and 1,000,000, said resin having distributed therethrough from about 0.01 to 1% by resin weight of a photosensitizer capable of generating free radicals upon exposure to actinic radiation and from about 0.1 to 10% by resin weight of a multifunctional olefin crosslinking agent for said rubber-like polymer constituent.

2. A photoresist material in accordance with claim 1 wherein said conjugated diene is polybutadiene.

3. A photoresist material in accordance with claim 1 wherein said conjugated diene is polyisoprene.

4. A photoresist material in accordance with claim 1 wherein the concentration of said photosensitizer is graduated through the thickness of said sheet.

5. A photoresist material in accordance with claim 1 wherein said actinic radiation is in the ultraviolet wavelength range.

6. A method of forming a printing plate suitable for letterpress printing, comprising the steps of (a) exposing to actinic radiation through a process transparency a photoresist sheet comprising an essentially colorless elastomeric resin characterized as being a block copolymer formed of a nonelastic thermoplastic styrene polymer constituent which is an amorphous polymer having a glass transition temperature above about 25° C. and a molecular weight between about 2000 and 100,000 and a rubber-like constituent capable of being crosslinked which is an amorphous polymer having a glass transition temperature below about 10° C. and a molecular weight between about 25,000 and 1,000,000, said resin having distributed therethrough from about 0.01 to 1% by resin weight of a photosensitizer capable of generating free radicals upon exposure to said actinic radiation and from about 0.1 to 10% by resin weight of a multifunctional olefin crosslinking agent for said rubber-like polymer constituent, said exposing resulting in the crosslinking of said resin where said actinic radiation is transmitted through the areas of said transparency; and (b) treating said resin with a solvent for said resin which is a nonsolvent for the crosslinking resin thereby to form raised printing areas corresponding to the areas in said transparency through which said actinic radiation was transmitted.

7. A method in accordance with claim 6 wherein said conjugated diene is polybutadiene.

8. A method in accordance with claim 6 wherein said conjugated diene is polyisoprene.

9. A method in accordance with claim 6 including the step of affixing the exposed photoresist sheet to a substrate backing before said treating step.

10. A method in accordance with claim 6 wherein said treating is carried out for a time and under conditions to leave a portion of the unexposed, noncrosslinked resin as a substrate backing and including the step of exposing the printing plate thus formed to actinic radiation whereby said substrate backing is crosslinked.

11. A method in accordance with claim 6 wherein said exposing is accomplished while said photoresistive sheet is mounted on the surface of a cylinder.

12. A method in accordance with claim 6 wherein said actinic radiation is in the ultraviolet wavelength range.

13. A method of makng a photoresist sheet suitable for forming directly into a letterpress printing plate, comprising the steps of (a) mixing with an essentially colorless elastomeric resin characterized as being a block copolymer formed of a nonelastic thermoplastic styrene ploymer constituent which is an amorphous polymer having a glass transition temperature above about 25° C. and a molecular weight between about 25,000 and 100,000 and a rubber-like conjugated diene and a rubber-like conjugated diene polymer constitutent capable of being crosslinked which is an amorphous polymer having a glass transition temperature below about 10° C. and a molecular weight between about 25,000 and 1,000,000 from about 0.01 to 1% by resin weight of a photosensitizer capable of generating free radicals upon exposure to actinic radiation and from about 0.1 to 10% by resin weight of a multifunctional olefin crosslinking agent for said rubber-like polymer constituent; and (b) forming the resulting mixture into sheet form.

14. A method in accordance with claim 13 wherein said mixing comprises dissolving said resin, photosensitizer and crosslinking agent in a solvent for said resin whereby said photosensitizer and crosslinking agent are uniformly distributed through said resin, removing said solvent, and comminuting the resulting resinous material prior to forming sheets thereof.

15. A method in accordance with claim 13 wherein a series of thin sheets are formed having different photosensitizer concentrations and said thin sheets are hot pressed into a composite sheet having a photosensitizer concentration gradient throughout its thickness.

References Cited

UNITED STATES PATENTS

| | | | |
|---|---|---|---|
| 3,380,831 | 4/1968 | Cohen et al. | 96—115 |
| 3,368,900 | 2/1968 | Burg | 96—115 |
| 3,261,686 | 7/1966 | Celeste | 96—115 |
| 3,024,180 | 3/1962 | McGraw | 96—115 X |
| 3,265,765 | 8/1966 | Holden et al. | 260—23.7 X |
| 3,467,523 | 9/1969 | Seidel et al. | 96—115 |
| 3,537,853 | 11/1970 | Wessells et al. | 96—115 |
| 2,964,401 | 12/1960 | Plambeck | 96—115 X |
| 3,157,505 | 11/1964 | Notley | 96—115 X |
| 3,210,187 | 10/1965 | Thommes | 96—115 X |

FOREIGN PATENTS

| | | | |
|---|---|---|---|
| 614,181 | 2/1961 | Canada | 96—115 P |

RONALD H. SMITH, Primary Examiner

U.S. Cl. X.R.

96—115 R

UNITED STATES PATENT OFFICE

CERTIFICATE OF CORRECTION

Patent No. 3,674,486 Dated July 4, 1972

Inventor(s) Jack Milgrom

It is certified that error appears in the above-identified patent and that said Letters Patent are hereby corrected as shown below:

Column 6, line 62, at the end of the line after "rubber-like" insert --conjugated diene polymer--.

Signed and sealed this 9th day of January 1973.

(SEAL)
Attest:

EDWARD M.FLETCHER,JR.
Attesting Officer

ROBERT GOTTSCHALK
Commissioner of Patents